(12) United States Patent
Lee (10) Patent No.: US 7,336,548 B2
(45) Date of Patent: Feb. 26, 2008

(54) CLOCK GENERATING CIRCUIT WITH MULTIPLE MODES OF OPERATION

(75) Inventor: Seong-Hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/542,918

(22) Filed: Oct. 3, 2006

(65) Prior Publication Data

US 2007/0035336 A1    Feb. 15, 2007

Related U.S. Application Data

(63) Continuation of application No. 11/054,885, filed on Feb. 9, 2005, now Pat. No. 7,130,226.

(51) Int. Cl.
  *G11C 7/00* (2006.01)
(52) U.S. Cl. ....................... 365/194; 365/233
(58) Field of Classification Search ................ 365/194, 365/223, 236, 233; 327/161
See application file for complete search history.

(56) References Cited

U.S. PATENT DOCUMENTS

| 4,965,810 | A | 10/1990 | Peischl et al. ............. 375/80 |
| 5,077,686 | A | 12/1991 | Rubinstein ................ 395/550 |
| 5,233,316 | A | 8/1993 | Yamada et al. ............ 331/45 |
| 5,574,508 | A | 11/1996 | Diamant ..................... 348/511 |
| 5,675,273 | A | 10/1997 | Masleid ...................... 327/156 |
| 5,757,218 | A | 5/1998 | Blum ......................... 327/175 |
| 5,910,740 | A | 6/1999 | Underwood ................ 327/149 |
| 5,946,244 | A | 8/1999 | Manning .................... 365/194 |
| 5,955,905 | A | 9/1999 | Idei et al. .................. 327/160 |
| 6,069,508 | A | 5/2000 | Takai ........................ 327/161 |
| 6,087,868 | A | 7/2000 | Millar ....................... 327/156 |
| 6,107,891 | A | 8/2000 | Coy ........................... 331/18 |
| 6,150,856 | A | 11/2000 | Morzano ................... 327/149 |
| 6,194,932 | B1 | 2/2001 | Takemae et al. .......... 327/158 |
| 6,239,641 | B1 | 5/2001 | Lee ........................... 327/270 |
| 6,240,042 | B1 | 5/2001 | Li ............................. 365/233 |

(Continued)

OTHER PUBLICATIONS

Chae, Jeong-Seok et al., "Wide Range Single-Way-Pumping Synchronous Mirror Delay", IEEE Electronics Letter Online No. 20000711, Feb. 11, 2000, pp. 939-940.

(Continued)

*Primary Examiner*—Anh Phung
(74) *Attorney, Agent, or Firm*—Dorsey & Whitney, LLP (57) ABSTRACT

A clock generating circuit includes a phase comparison circuit that generates a delay control signal corresponding to the relative phases of an output clock signal and a reference clock signal. A voltage controlled delay circuit generates the delayed clock signal by inverting a signal applied to its input and delaying the signal by a delay that is determined by a delay control signal. A selection circuit couples either the reference clock signal or the delayed clock signal to the input of the voltage controlled delay circuit. When the reference clock signal is coupled to the input of the voltage controlled delay circuit, the clock generating circuit functions as a delay-lock loop. When the delayed clock signal is coupled to the input of the voltage controlled delay circuit, the voltage controlled delay circuit operates as a ring oscillator so that the clock generating circuit functions as a phase-lock loop.

12 Claims, 11 Drawing Sheets

U.S. PATENT DOCUMENTS

| | | | |
|---|---|---|---|
| 6,304,117 B1 | 10/2001 | Yamazaki et al. | 327/158 |
| 6,310,822 B1 | 10/2001 | Shen | 365/233 |
| 6,330,197 B1 | 12/2001 | Currin et al. | 365/194 |
| 6,340,904 B1 | 1/2002 | Manning | 327/156 |
| 6,373,307 B1 | 4/2002 | Takai | 327/161 |
| 6,378,079 B1 | 4/2002 | Mullarkey | 713/401 |
| 6,404,248 B1 | 6/2002 | Yoneda | 327/158 |
| 6,426,900 B1 | 7/2002 | Maruyama et al. | 365/194 |
| 6,445,231 B1 | 9/2002 | Baker et al. | 327/158 |
| 6,480,047 B2 | 11/2002 | Abdel-Maguid et al. | 327/161 |
| 6,484,268 B2 | 11/2002 | Tamura et al. | 713/600 |
| 6,490,207 B2 | 12/2002 | Manning | 365/194 |
| 6,556,488 B2 | 4/2003 | Han | 365/194 |
| 6,556,489 B2 | 4/2003 | Gomm et al. | 365/194 |
| 6,570,813 B2 * | 5/2003 | Van De Graaff | 365/233 |
| 6,621,762 B1 | 9/2003 | Roohparvar | 365/233 |
| 6,665,219 B2 * | 12/2003 | Li et al. | 365/194 |
| 6,727,740 B2 | 4/2004 | Kirsch | 327/161 |
| 6,728,163 B2 | 4/2004 | Gomm et al. | 365/233 |
| 6,759,911 B2 | 7/2004 | Gomm et al. | 331/10 |
| 6,803,826 B2 | 10/2004 | Gomm et al. | 331/11 |
| 2002/0167346 A1 | 11/2002 | Yoon et al. | 327/158 |
| 2002/0176315 A1 | 11/2002 | Graaff | 365/233 |
| 2002/0180499 A1 | 12/2002 | Kim et al. | 327/158 |

OTHER PUBLICATIONS

Jang, Seong-Jin et al., A Compact Ring Delay Line for High Speed Synchronous DRAM, IEEE Symposium on VLSI Circuits Digest of Technical Papers, 1998, pp. 60-61.

Kuge, Shigehiro et al., "A 0.18 μm 256Mb DDR-SDRAM with Low-Cost Post-Mold-Tuning Method for DLL Replica", IEEE International Solid-State Circuits Conference, Feb. 2000, pp. 402-403.

Kuge, Shigehiro et al., "A 0.18 μm 256Mb DDR-SDRAM with Low-Cost Post-Mold-Tuning Method for DLL Replica", IEEE International Solid-State Circuits, vol. 35, No. 11, Nov. 2000, pp. 1680-1689.

Saeki, Takanori et al., "A 2.5ns Clock Access 250MHz 256Mb SDRAM with a Synchronous Mirror Delay", IEEE International Solid-State Circuits Conference, Feb. 1996, pp. 374-375.

Takai, Yasuhiro et al., A 250Mb/s/pin 1Gb Double Data Rate SDRAM with a Bi-Directional Delay and an Inter-Bank Shared Redundancy Scheme, 1999.

* cited by examiner

CLOCK GENERATING CIRCUIT WITH MULTIPLE MODES OF OPERATION

CROSS-REFERENCE TO RELATED APPLICATION

This application is a continuation of U.S. patent application Ser. No. 11/054,885, filed Feb. 9, 2005, now U.S. Pat. No. 7,130,226, issued on Oct. 31, 2006.

TECHNICAL FIELD

The present invention relates generally to clock generating circuits, and more specifically to a clock generating circuit with multiple modes of operation.

BACKGROUND OF THE INVENTION

Many electronic systems, such as memory devices, use a clock generating circuit that generates an internal clock signal that is phase aligned to an external clock signal. The phase alignment is necessary so that data can be exchanged reliably between the electronic systems and external devices.

Figure 1:
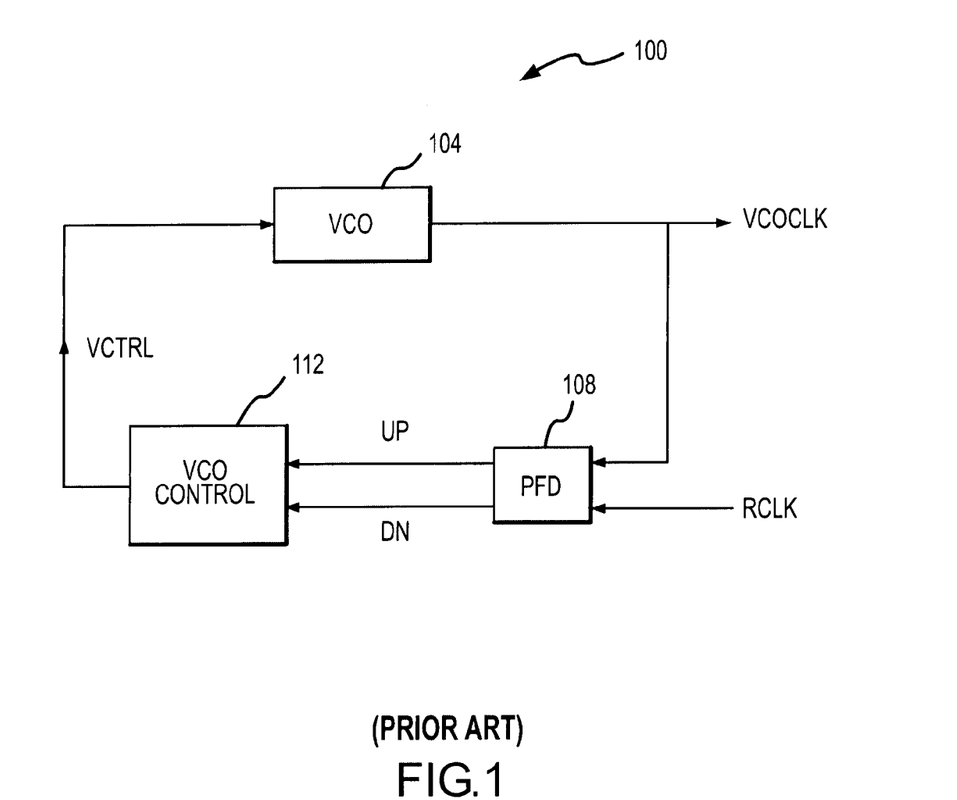
FIG. 1 is a functional block diagram of a conventional phase locked loop (PLL).

A phase locked loop (PLL) is a clock generating circuit that is often used to generate an internal clock signal that is aligned to an external clock signal. FIG. 1 is a functional block diagram of a conventional phase locked loop (PLL) 100. The PLL 100 includes a voltage controlled oscillator (VCO) 104 that receives a VCO control (VCTRL) signal and generates a VCO clock (VCOCLK) signal. The PLL 100 also includes a phase frequency detector (PFD) 108 coupled to the VCO 104. The PFD 108 compares the phase of the VCOCLK signal to the phase of the reference clock (RCLK) signal to generate an UP and a DN signal depending on the relative phases of the VCOCLK and RCLK signals.

The PLL 100 also includes a VCO control circuit 112 coupled to the PFD 108. The VCO control circuit 112 receives the UP and DN signals, and generates the VCTRL signal. The VCTRL signal is a phase error signal having a magnitude that increases responsive to the UP signal and decreases responsive to the DN signal.

Figure 2A:
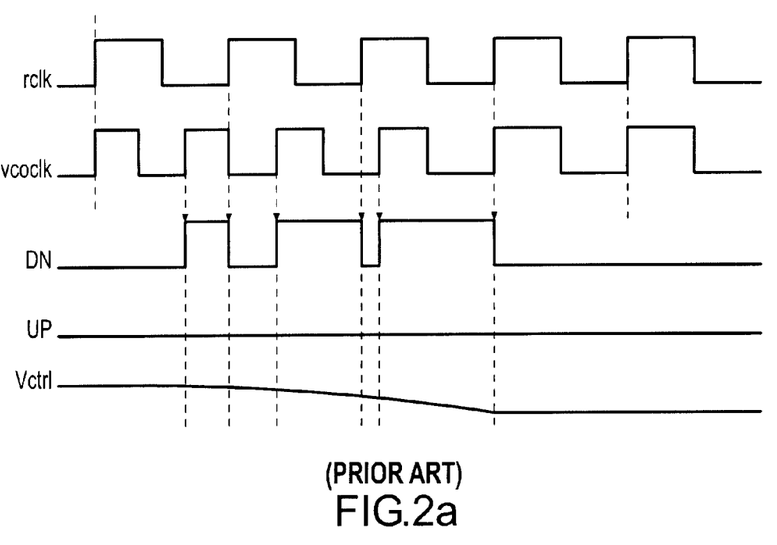
FIGS. 2(a) and 2(b) are signal timing diagrams illustrating various signals generated during operation of the PLL of FIG. 1.

FIGS. 2(a) and 2(b) are example signal timing diagrams illustrating various signals generated during operation of the PLL 100 of FIG. 1. In the example of FIG. 2(a) the VCOCLK signal leads the RCLK signal, and in response to a rising edge of the VCOCLK signal, the PFD 108 drives the DN signal high. The DN signal remains high until the PFD 108 receives the next rising edge of the RCLK signal. In FIG. 2(a) the UP signal always remains low because the RCLK signal never leads the VCOCLK signal. When the DN signal is high, the VCTRL signal decreases, which adjusts the VCOCLK signal so that the phase of the VCOCLK signal is aligned to the phase of the RCLK signal.

Figure 2B:
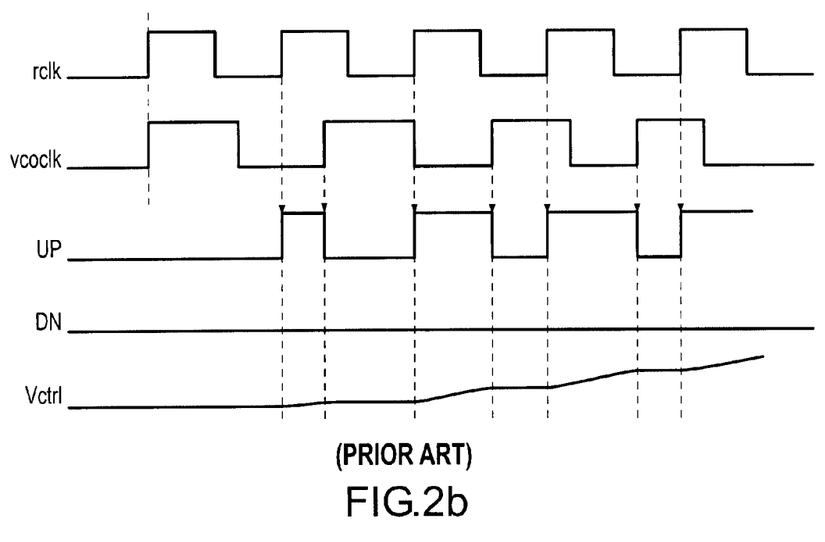

In the example of FIG. 2(b), the RCLK signal leads the VCOCLK signal. In response to a rising edge of the RCLK signal, the PFD 108 drives the UP signal high. The UP signal remains high until the PFD 108 receives the next rising edge of the VCOCLK signal. The DN signal always remains low because the VCOCLK signal never leads the RCLK signal. As shown in FIG. 2(b), when the UP signal is high, the VCTRL signal increases, which adjusts the VCOCLK signal until it is aligned with the RCLK signal.

When the PLL 100 is initially powered, the frequency of the VCOCLK signal may be different from the frequency of the RCLK signal. The UP and DN signals cause the frequency of the VCOCLK signal to be gradually pulled toward the frequency of the RCLK signal. If the frequency of the VCOCLK signal is less than the frequency of the RCLK signal, the UP signal causes the frequency of the VCOCLK signal to increase until the frequencies of the VCOCLK and RCLK signals are closely matched. If the frequency of the VCOCLK signal is greater than the frequency of the RCLK signal, the DN signal causes the frequency of the VCOCLK signal to decrease until the frequencies of the VCOCLK and RCLK signals are closely matched. When the frequency of the VCOCLK signal is closely matched to the frequency of the RCLK signal, the PLL 100 is considered "locked." The VCTRL signal is then used to adjust the phase of the VCOCLK signal until the VCOCLK and RCLK signals are phase aligned. However, it can require a considerable period of time for the PLL 100 to achieve a locked condition.

Figure 3:
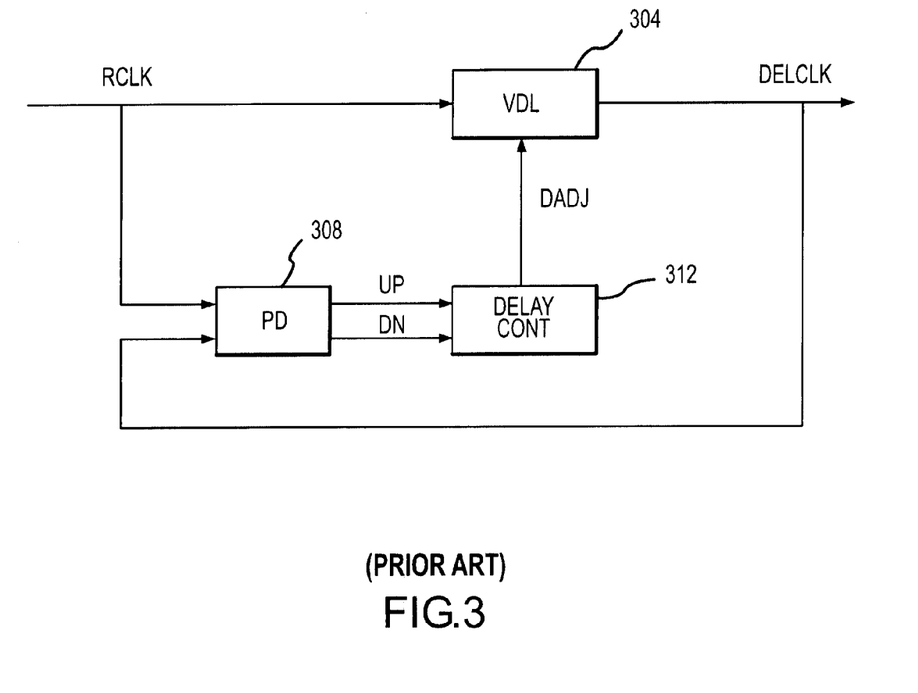
FIG. 3 is a functional block diagram of a conventional delay locked loop (DLL).

A delay locked loop (DLL) is also used as a clock generating circuit to align an external clock signal to an internal clock signal. FIG. 3 is a functional block diagram of a conventional DLL 300. The DLL 300 includes a variable delay line (VDL) 304 that receives an external clock (RCLK) signal and generates a delayed clock (DELCLK) signal in response to the RCLK signal. The DLL 300 further includes a phase detector 308 that receives the RCLK and DELCLK signals and generates an UP and a DN signal. The respective values of the UP and DN signals depend on the phase difference between the RCLK and DELCLK signals.

If the DELCLK signal lags the RCLK signal by less than one cycle, the DN signal goes high and remains high until the next rising edge of the RCLK signal. When the DELCLK signal lags the RCLK signal by less than one cycle, the UP signal remains low.

If the DELCLK signal lags the RCLK signal by more than one cycle, the UP signal goes high and remains high until the next rising edge of the DELCLK signal. When the DELCLK signal lags the RCLK signal by more than one cycle, the DN signal remains low.

A delay controller 312 generates a DADJ signal in response to the UP and DN signals from the phase detector 308. The delay controller 312 applies the DADJ signal to the VDL 304 to adjust the variable delay of the VDL 304. The phase detector 308 and the delay controller 312 operate in combination to adjust the variable delay of the VDL 304 as a function of the detected phase between the RCLK and DELCLK signals until the phase difference between the RCLK and DELCLK signals is approximately zero.

Figure 4A:
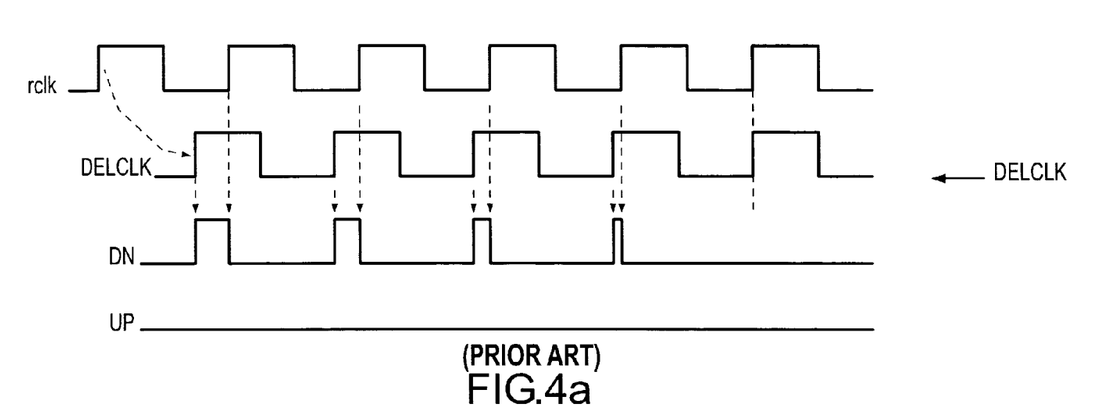
FIGS. 4(a) and 4(b) are signal timing diagrams illustrating various signals generated during operation of the DLL of FIG. 3.

FIGS. 4(a) and 4(b) are signal timing diagrams illustrating various signals generated during operation of the DLL 300 of FIG. 3. In FIG. 4(a) the DELCLK signal lags the RCLK signal by less than one cycle. In response to a rising edge of the DELCLK signal, the PD 308 drives the DN signal high where it remains until the next rising edge of the RCLK signal In FIG. 4(a) the UP signal always remains low because the RCLK signal never leads the DELCLK signal.

Figure 4B:
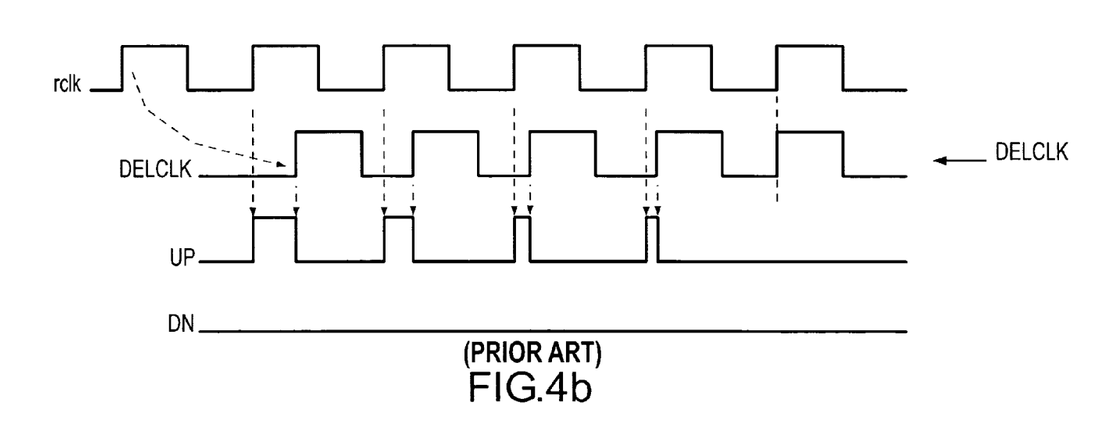

In FIG. 4(b) the DELCLK signal lags the RCLK signal by more than one cycle. In response to a rising edge of the RCLK signal, the PD 308 drives the UP signal high where it remains until the next rising edge of the DELCLK signal. In FIG. 4(b) the DN signal always remains low because the VCOCLK never leads the RCLK signal.

As discussed before with reference to FIGS. 4(a) and 4(b), the DLL 300 adjusts only the phase of the DELCLK signal. Thus, the DLL 300 typically provides faster lock than the PLL 100 because the PLL 100 must initially adjust the frequency of the VCOCLK signal. However, since the DLL 300 uses the RCLK signal to generate the DELCLK signal, any jitter present in the RCLK signal will be present in the DELCLK signal. Thus, the DLL 300 is typically used when there is a relatively clean (i.e., less jittery) RCLK signal or jitter can be tolerated.

Accordingly, there is a need for a clock generating circuit that allows an internal clock signal to be quickly aligned to an external clock signal, and which is not susceptible to high frequency jitters in the external clock signal.

SUMMARY OF THE INVENTION

A closed loop clock generating circuit includes an inverting voltage controlled delay circuit that generates a delayed clock signal at its output. A phase comparator comparing the phase of the delayed clock signal to the phase of a reference clock signal and generates a phase error signal corresponding thereto. The phase error signal is used to adjust the delay of the delay circuit. The clock generating circuit includes mode control circuitry that selects either the reference clock signal or the delayed clock signal for coupling to the input of the delay circuit. When the reference clock signal is selected, the clock generating circuit functions as a delay-locked loop. When the delayed clock signal is selected, the clock generating circuit functions as a phase-locked loop with the delay circuit operating as a ring oscillator.

DETAILED DESCRIPTION OF PREFERRED EMBODIMENTS

Figure 5:
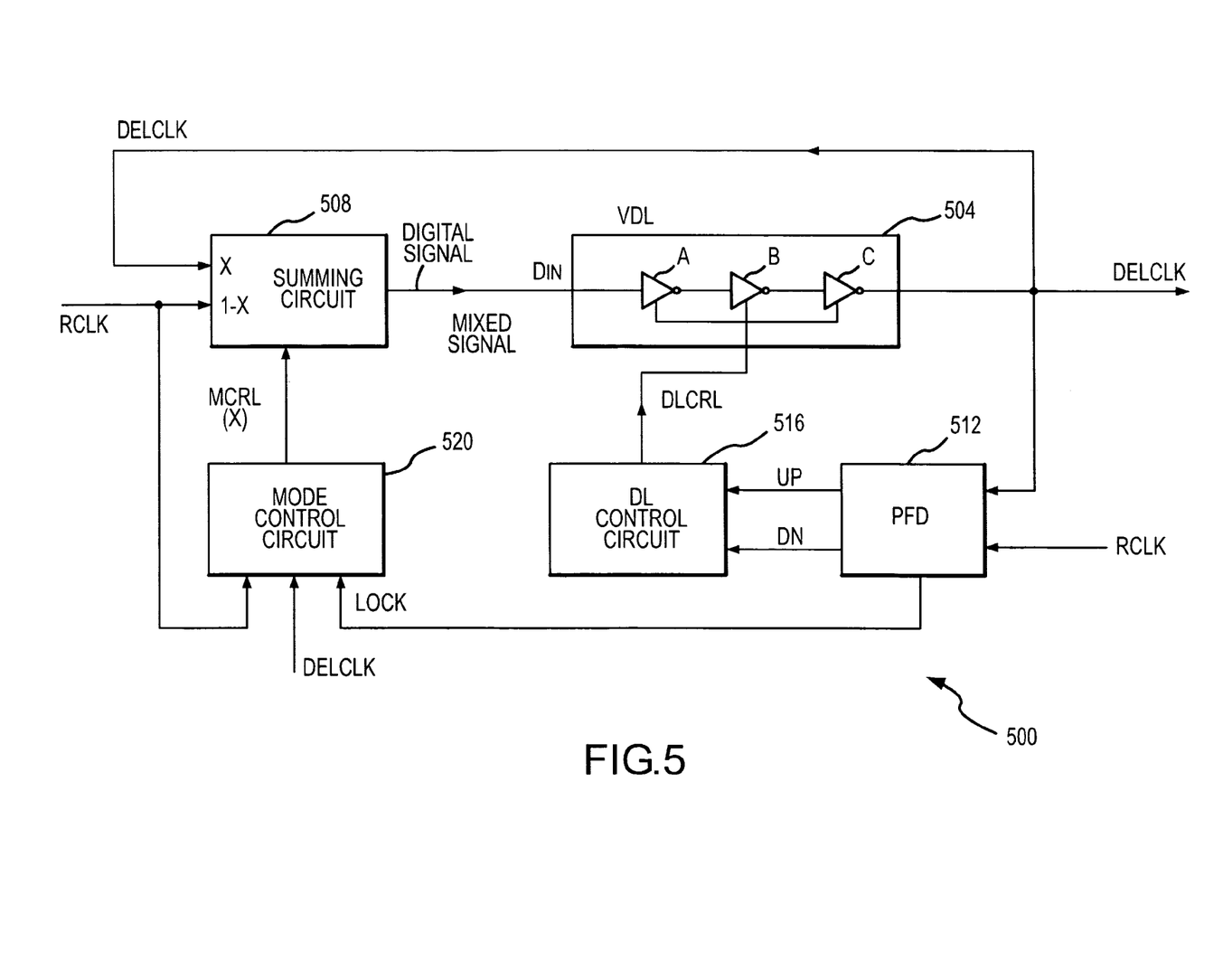
FIG. 5 is a functional block diagram of a clock generating circuit in accordance with one embodiment of the invention.

FIG. 5 is a functional block diagram of a clock generating circuit 500 in accordance with one embodiment of the invention. The clock generating circuit 500 includes a voltage controlled delay line ("VDL") 504 that receives a delay input ("DIN") signal signal from a summing circuit 508 and generates a delayed clock ("DELCLK") signal in response to the digital signal. The VDL 504 is constructed with inverters A, B and C connected as shown in FIG. 5. The VDL 504 inverts and delays the DIN signal, the delay amount being controlled by a delay control ("DLCRL") signal, to generate the DELCLK signal.

The summing circuit 508 generate the DIN signal by selecting all or a portion of the DELCLK signal or all or a portion of an external reference clock ("RCLK") signal depending on the value of a mode control ("MCRL") signal. The DIN signal, more specifically, can be represented by $F(X)=X*DELCLK+(1-X)*RCLK$, where X represents the magnitude of the MCRL signal. When, X=0, F(X)=RCLK. Thus, when X=0, the summing circuit 508 outputs the RCLK signal. When X=1, F(X)=DELCLK. Thus, when X=1, the summing circuit 508 outputs the DELCLK signal. When switching between 0 and 1 in this manner, the summing circuit 508 acts as a multiplexer by selecting either the DELCLK signal or the RCLK signal, respectively, as the DIN signal. The MCRL signal can also have a value X between 0 and 1, e.g., 0.5, $F(X)=0.5*DELCLK+0.5*RCLK$, for reasons that will be explained below.

The clock synchronization circuit 500 also includes a phase detector (PD) 512, which compares the phase of the DELCLK signal to the phase of the RCLK signal and generates a corresponding phase error signal. The phase error signal generated by the PD 512 includes either an UP signal or a DN signal depending on whether the DELCLK signal leads or lags the RCLK signal, respectively. The UP and DN signals are applied to a delay line control circuit 516 which generates the DLCRL signal. The magnitude of the DLCRL signal changes in a manner that increases the delay of the VDL 504" responsive to the UP signal and decreases the delay of the VDL 504" responsive to the DN signal.

A mode control circuit 520 is also included in the clock generating circuit 500. The mode control circuit 520 receives the RCLK and DELCLK signals, as well as a LOCK signal that is generated by the PD 512 when it determines that the phase of the DELCLK signal is substantially equal to the phase of the RCLK signal. The mode control circuit 520 then selects a value X for the MCRL signal for reasons that will be described below.

Figure 6:
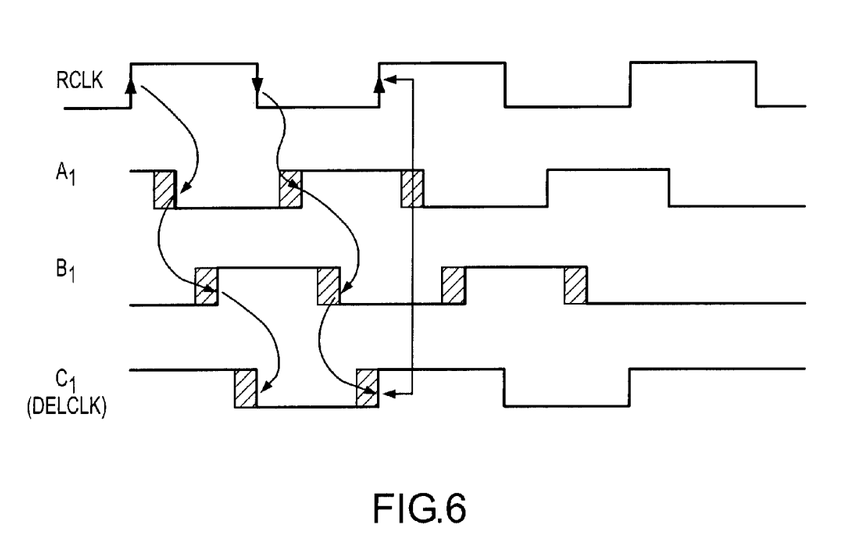
FIGS. 6-10 are signal timing diagrams illustrating various signals generated by the clock generating circuit of FIG. 5.

Unlike most clock generating circuits, which operate as either a dedicated DLL or a dedicated PLL, the clock generating circuit 500 can operate as either a DLL or a PLL depending on the value of the MCRL signal. The operation of the circuit 500 in the DLL mode when the value of the MCRL signal, X, is equal to zero will be explained first. As explained above, when X is equal to zero, the summing circuit 508 couples the RCLK circuit to the input of the VDL 504. The VDL 504 then inverts and delays the RCLK signal to generate the DELCLK. More specifically, as shown in FIG. 6, as the RCLK signal propagates through the inverter A, it is inverted and delayed by the time required for the RCLK signal to propagate through the inverter A. The output of the inverter A is shown as the A1 signal, and the delay is represented by the shaded area.

The A1 signal is next inverted and delayed by the inverter B. The output of the inverter B is shown as the B1 signal, and the propagation delay through the inverter B is represented by the shaded area. The B1 signal is next inverted and delayed by the inverter C. The output of the inverter C is shown as the C1 signal. As shown in FIG. 5, the output of the inverter C (i.e., C1 signal) is also designated as the DELCLK signal. The PD 512 compares the rising edge of the DELCLK (C1) signal to the rising edge of the RCLK signal. The PD 512 detects the phase difference between the DELCLK and RCLK signals, and causes the delay line control circuit 516 to adjust the delay of the VDL 514 until the phase of the DELCLK signal is substantially equal to the phase of the RCLK signal. Each of the inverters A, B, C, delay the RCLK signal by 180 degrees plus the propagation delay DEL of the inverter, which is represented by the shaded area. The total delay of the inverters A, B, C is therefore 3(180 degrees+DEL), which must equal 360N degrees (where N is an integer) since the phase of the DELCLK signal is substantially equal to the phase of the RCLK signal. Thus, 540 degrees+3DEL is equal to 720 degrees, so that 3DEL is equal to 180 degrees. Therefore, the delay of the VDL 514 is adjusted so that the propagation delay of each inverter A, B, C is 60 degrees.

As noted before, the clock generating circuit 500 can also be operated as a PLL. When X is equal to 1, the summing circuit 508 couples the DELCLK signals to the input of the VDL 504. The VDL 504 then functions as a ring oscillator since the inverters A, B, C invert the DELCLK signal an odd number of times. The PD 512 compares the phase of the DELCLK signal to the phase of the RCLK signal to generate either an UP signal or a DN signal depending on the difference in phase between the DELCLK and RCLK signals. The UP or DN signals cause the delay line control circuit 516 to generate a DLCRL signal that adjusts the delay of the VDL 504, thereby adjusting the phase of the DELCLK signal so that it is equal to the phase of the RCLK signal. The signals generated during the operation of the circuit 500 as a PLL are similar to the signals generated by the PLL 100 and are shown in FIGS. 2(*a*) and 2(*b*).

The adjustment of the delay provided by the VDL 506 causes the total propagation delays 3DEL of the inverters A, B, C is equal to one-half the period of the RCLK signal so that the phase of the DELCLK signal is equal to the phase of the RCLK signal. Thus, the total propagation delay 3DEL is equal to 180 degrees at the frequency of the RCLK signal, so that the delay DEL of each of the inverters A, B, C is 60 degrees. The delay of the VDL 506 when the clock generating circuit 500 is operating as a PLL is therefore the same as the delay when the circuit 500 is operating as a DLL. For reasons that will be explained below, this property is very useful in the clock generating circuit 500. In adjusting the phase of the DELCLK signal so that it is equal to the phase of the RCLK signal, the VDL 504 inherently adjusts the frequency of the ring oscillator created by the VDL so that the frequency of the DELCLK signal is equal to the frequency of the RCLK signal.

As previously explained, one disadvantage of using a DLL as a clock generating circuit is the presence of jitter in the DELCLK signal if jitter is present in the RCLK signal. In contrast, a DELCLK signal generated by a PLL does not include jitter present in the RCLK signal because the PLL generates its own independent internal clock signal. However, as discussed before, the PLL can require a relatively longer time to align the phase of a signal produced by a VCO to the RCLK signal since the frequency of the signal generated by the VCO must be adjusted to match the frequency of the RCLK signal. On the other hand the DLL can quickly align the phase of the DELCLK signal to the RCLK signal because no frequency adjustment is needed.

The clock generating circuit 500 can be operated in a manner that combines the advantages of the PLL and DLL circuits without their disadvantages. The circuit 500 can be operated during an initial power-up period as a DLL by the mode control circuit 520 outputting a MCRL signal value X equal to zero. Operating the circuit 500 as a DLL allows the circuit 500 to quickly align the phase of the DELCLK signal to the RCLK signal. As previously explained, when the phase of the DELCLK signal is equal to the phase of the RCLK signal, the total delay 3DEL of the VDL 504 will be equal to one-half of the period (i.e., 180 degrees) of the RCLK signal at the frequency of the RCLK signal. After the initial power-up period, the circuit 500 can be operated as a PLL by the mode control circuit 520 outputting a MCRL signal value X equal to one. When the circuit 500 starts operating as a PLL, the delay of the VDL 504 will already have been adjusted to one-half the period of the RCLK signal so that the frequency of the DELCLK signal output by the VDL 504 operating as a ring oscillator will already be equal to the frequency of the RCLK signal. The circuit operating as a PLL will therefore not require any time to adjust the frequency of the DELCLK signal so that it matches the frequency of the RCL signal. Furthermore, by operating as a PLL, the clock generating circuit provides immunity from any jitter present in the RCLK signal.

Figure 7:
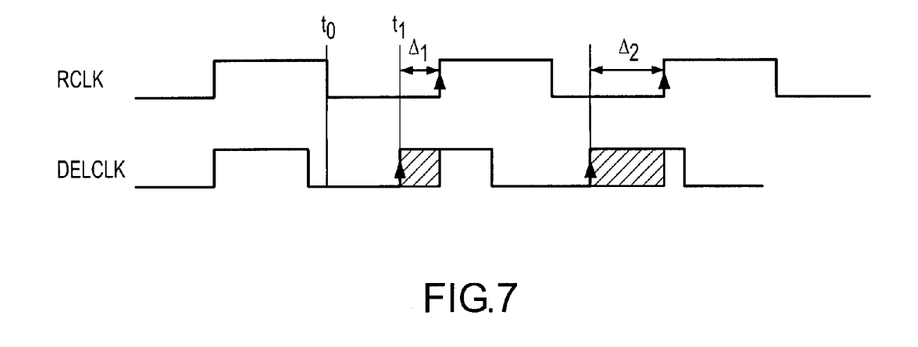

When the clock generating circuit 500 operates as a PLL, the output of the VDL 504, i.e., the DELCLK signal, is fed back to the input of the VDL 504, forming a closed loop. If the DELCLK signal suddenly changes due to a change in the supply voltage of the VDL 504 or some other disturbances, a phase error may result due to a difference in the phase of the DELCLK signal and the phase of the RCLK signal. FIG. 7 illustrates a scenario in which a sudden change of the DELCLK signal causes a phase error. At time t0, due a slight change of the DELCLK signal, the falling edge of the DELCLK signal occurs before the falling edge of the RCLK signal. As the DELCLK signal is fed back via the closed loop through the VDL 504, the falling edge becomes the next rising edge of the DELCLK signal at time t1. In the example of FIG. 7, the phase error is shown as Δ1. As the DELCLK signal is again fed back to the VDL 504 via the closed loop, the phase error accumulates and increases to Δ2. As will be understood by those skilled in the art, as phase error will accumulate as the DELCLK signal is fed back through the VDL 504 in each cycle. This increasing phase error will be detected by the PD 512, which will attempt to adjust the delay of the VDL 504 so that the phase error is substantially eliminated. However, since the PD 512 generally has a slow response rate, the phase error will accumulate considerably before the PFD 512 is able to correct the phase error.

The clock generating circuit 500 provides a solution to problem of phase error accumulation described above. Since the circuit 500 can selectively be operated as either a PLL or a DLL, the accumulated phase error can be easily eliminated by switching the operation of the circuit 500 into a DLL mode by setting X=0. When the circuit 500 operates as a DLL, the VDL 504 operates in an open-loop because the DELCLK signal is not fed back to the input of the VDL 504. In the DLL mode, the VDL 504 receives the RCLK signal, and generates the DELCLK signal by inverting and delaying the RCLK signal. Thus, any phase error resulting from a change in the DELCLK signal does not accumulate because the DELCLK signal is not fed back into the VDL 504. Once the phase error has been eliminated, X can be set to 1 so that the circuit 500 again operates as a PLL.

Figure 8:
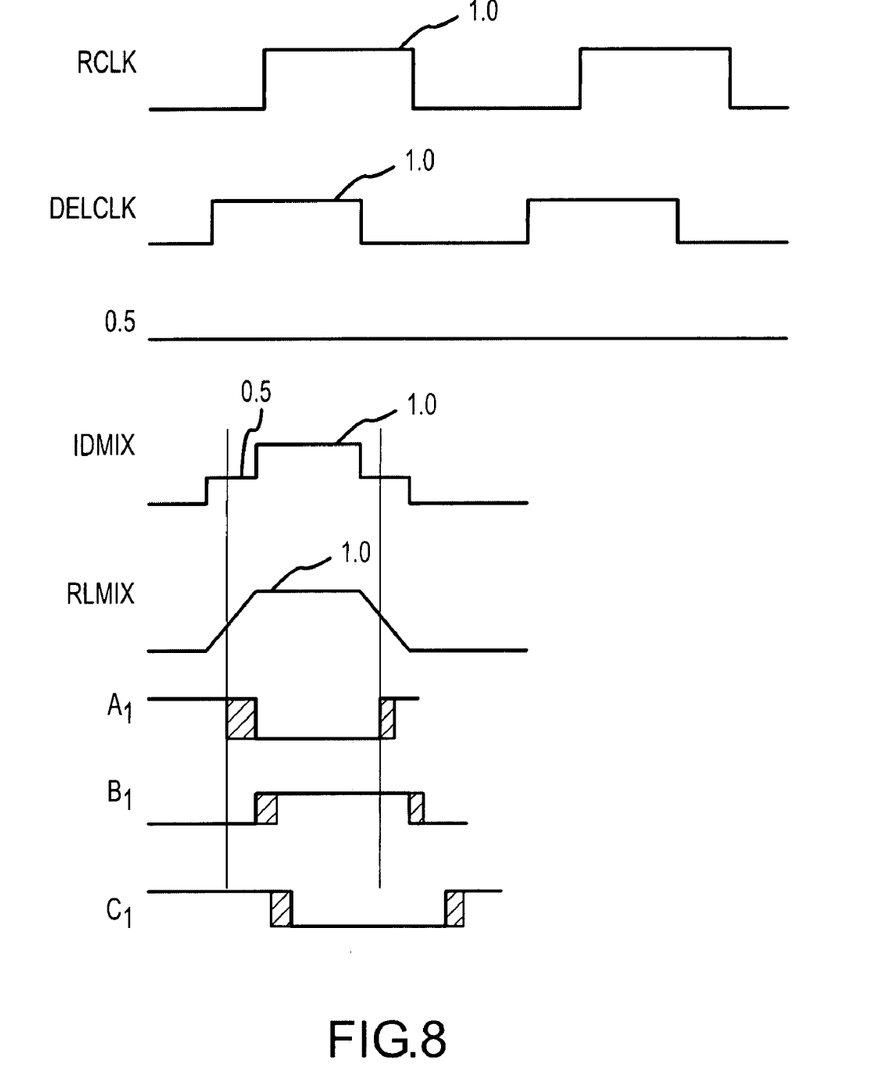
Figure 9:
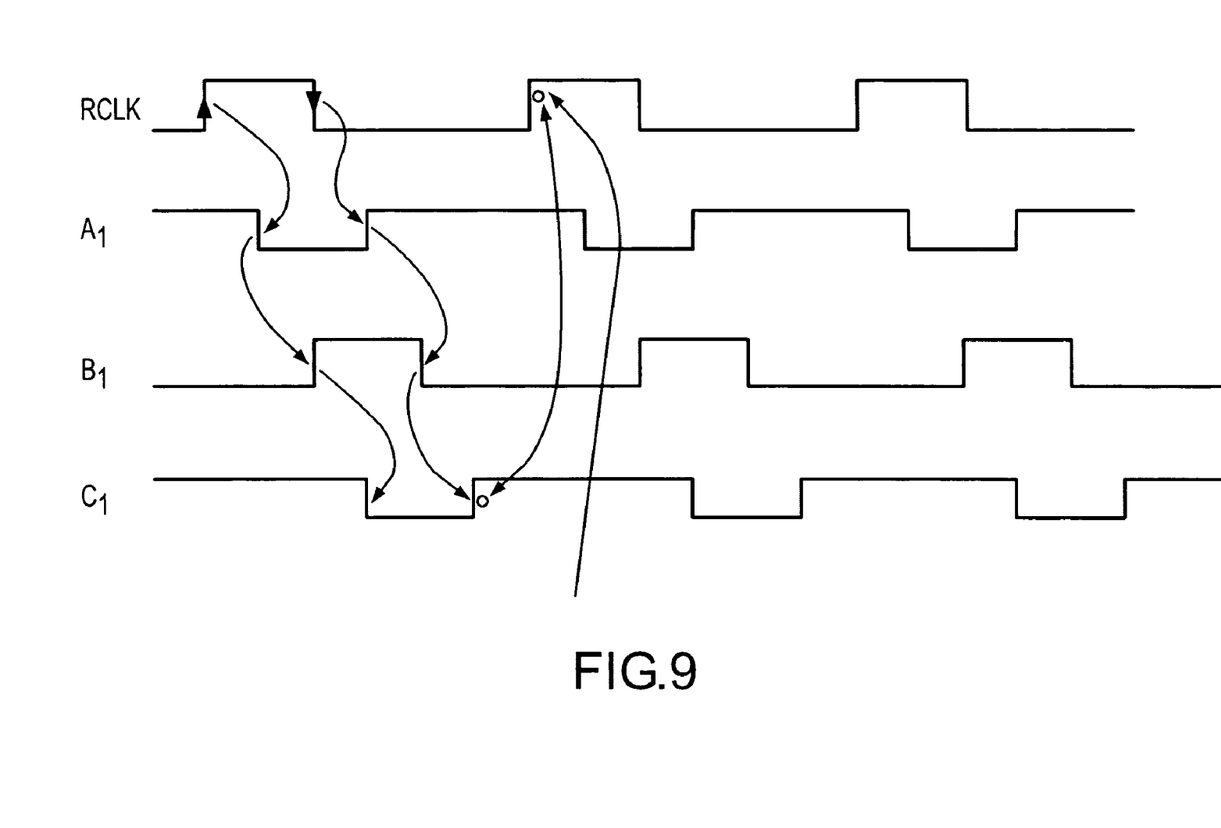

Although the clock generating circuit 500 can also be operated as either a DLL or a PLL, it can also operate in a hybrid mode in which it simultaneously operates as both a DLL and a PLL. This hybrid operation is accomplished by setting the MCRL signal at a fixed value that is between 0 and 1. FIG. 8 illustrates a scenario in which the MCRL signal is fixed so that X is equal to 0.5, and the DELCLK signal leads the RCLK signal. As described before, the output of the summing circuit, i.e., the mixed signal, is represented by F(X)=X*DELCLK+(1−X)*RCLK, where X represents the MCRL signal. In theory, the DIN signal, shown as IDMIX signal in FIG. 8, steps up from 0 to 0.5 at the rising edge of the DELCLK signal and then steps up again from 0.5 to 1 at the rising edge of the RCLK signal. The IDMIX signal steps down from 1 to 0.5 at the falling edge of the DELCLK signal and then steps down again from 0.5 to 0 at the falling edge of the RCLK signal. In reality, the capacitance in the summing circuit 508 causes the mixed signal to have a positive and a negative sloped section and a constant value section as shown in FIG. 8 (designated as RLMIX signal). The slope of the RLMIX signal can be controlled by varying the X value, i.e., the MCRL signal. The RLMIX signal is received by the VDL 504, and the inverter A (shown in FIG. 5) inside the VDL 504 inverts and delays the RLMIX signal to generate the A1 signal. As will be understood by those skilled in the art, the inverter inverts the RLMIX signal at approximately mid point of the sloped section of the RLMIX signal and then delays the signal by an amount equal to the shaded area in the A1 signal. The A1 signal is inverted and delayed by the inverter B (shown in FIG. 5) to generate the B1 signal. The B1 signal is inverted and delayed by the inverter C (shown in FIG. 5) to generate the C1 signal. The C1 signal is in fact the DELCLK signal whose phase can be controlled by varying the slope of the RLMIX signal. By varying the value of X, the slope of the RLMIX signal can be varied, thereby varying the phase of the DELCLK signal. Thus, if there is any accumulation of a phase error, the accumulated phase error can be reduced by varying the X value. As a result, the phase of the DIN signal can be made equal to the phase of the RCLK signal by making X=0, and the phase of the DIN signal can be made equal to the phase of the DELCLK signal (including any phase error in the DELCLK signal) by making X=1. The phase of the DIN signal can be adjusted to any value between the phase of the RCLK signal and the phase of the DELCLK signal by selecting a value of X between 0 and 1. Although lower values of X will more quickly reduce any accumulated phase error, it will also introduce a larger amount of any jitter that is present in the RCLK signal. Conversely, high values of X will require more time to reduce any accumulated phase error, but it will make the DELCLK more immune from any jitter that is present in the RCLK signal. Thus, a value of X can be selected based on a desired tradeoff between jitter and accumulated phase error.

Figure 10:
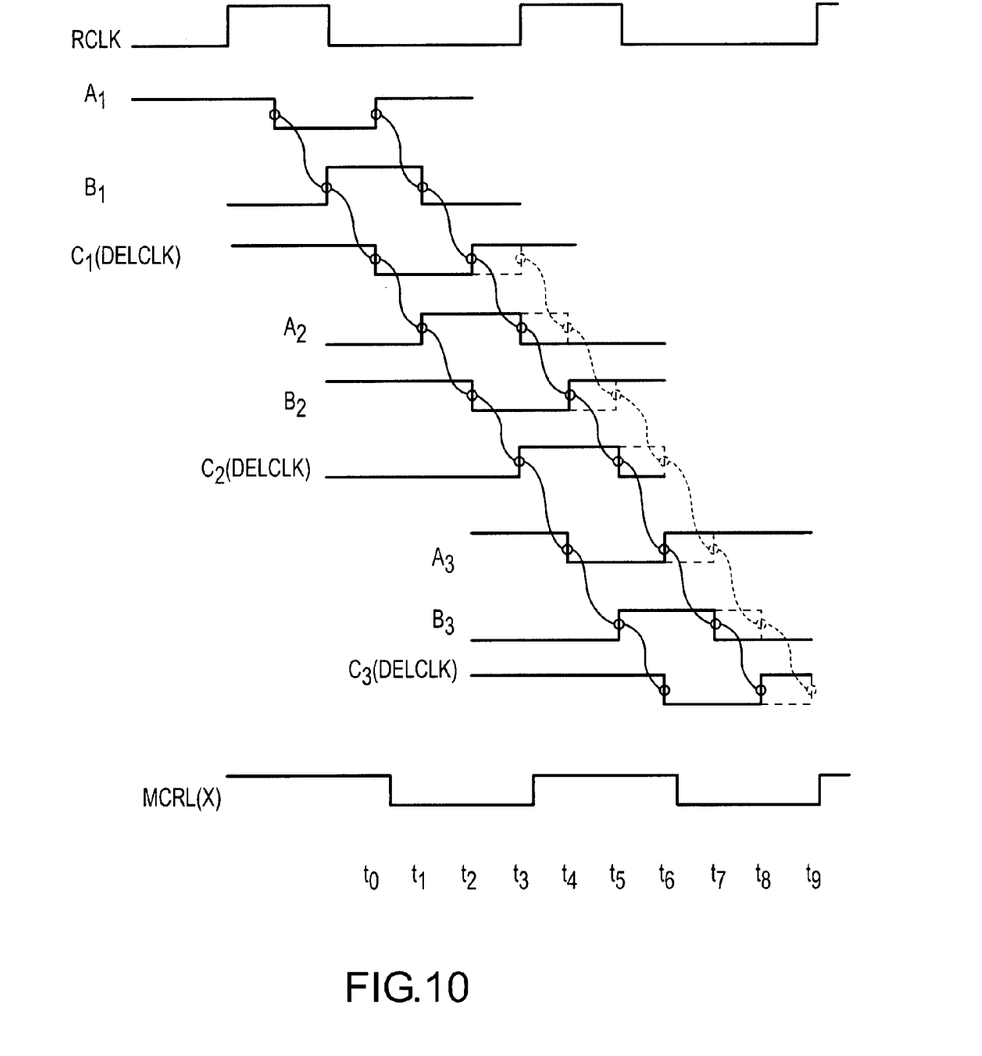

The foregoing explanation has assumed that the duty cycle of the RCLK signal is 50%. Unfortunately, the clock generating circuit operating in the PLL mode as explained above does not operate in an optimum manner when the duty cycle of the RCLK is not 50%. As shown in FIG. 10 (ignoring the portions of the signals shown in dotted lines), the VDL 504 initially receives an RCLK that has less than a 50% duty cycle, and it thereafter receives the DELCLK signal to operate as a PLL. It is assumed that the delay of the VDL 504 has been set so that the PLL is locked. The initial RCLK signal propagates through the inverter A, where it is inverted and delayed. The output of the inverter A is shown in FIG. 10 as the A1 signal. The A1 signal is next inverted and delayed by the inverter B to produce the B1 signal. The B1 signal is next inverted and delayed by the inverter C to produce the C1 signal. As shown by the lines connecting the rising and falling edges, the C1 signal (which is the same as the DELCLK signal) has a falling edge at time $t_0$ delayed by one-half the period of the RCLK signal. The C1 signal has a rising edge at time $t_2$ delayed from the falling edge of the RCLK signal.

The PD 512 compares the rising edge of the DELCLK (C1) signal, which occurs at $t_2$, to the rising edge of the RCLK signal, which occurs at $t_3$. Since the rising edge of the DELCLK signal is delayed from the falling edge of the RCLK signal, and the falling edge of the RCLK signal does not occur at a 180 degree phase, the rising edge of the DELCLK signal at $t_2$ is not be aligned with the rising edge of the RCLK signal at $t_3$. As a result, the PFD 512 will detect a phase difference (i.e., phase error) between the RCLK and DELCLK signals even though a phase error does not exist. This problem will occur whenever the duty cycle of the RCLK signal differs from 50%.

It should also be noted that the falling edge of the DELCLK signal at time $t_0$ is delayed from the rising edge of the RCLK signal so that it does have the "correct" phase, i.e., a phase of 0 degrees or 180 degrees. The falling edge of the DELCLK signal at time $t_0$ propagates through the inverters A, B, C to generate the signals A2, B2, C2, respectively. Since the falling edge of the C1 signal occurred at 180 degrees relative to the RCLK signal, the rising edge of the C2 signal occurring at time t3 is aligned with the rising edge of the RCLK signal. As a result, the PD 512 correctly detects that there is no phase error. However, since the falling edge of the C2 signal at time $t_5$ was generated by delaying the falling edge of the RCLK signal by two passes through the inverters A, B, C, the falling edge of the C2 signal does not occur at 180 degrees relative to the RCLK signal. As a result, when the falling edge of the C2 signal occurring at time $t_5$ propagates through the inverters A, B, C, it produces a rising edge of the C3 signal at time $t_8$. This rising edge of the C3 signal is not aligned with the rising edge of the RCLK signal, which occurs at time $t_9$. The PD 512 will therefore again generate a spurious indication that a phase error is present. Since, the PD will detect a spurious error at alternate rising edges of the DELCLK signal, the PD 512 will provide a spurious error indication corresponding to one-half the deviation of the duty cycle from 50%.

The clock generating circuit is able to avoid this spurious error by switching the MCRL signal generated by the mode control circuit 520 between 0 and 1 as shown by the signals shown in dotted lines FIG. 10. As shown in FIG. 10, the MCRL signal X is switched to 0 by the falling edge of the DELCLK signal. As a result, the summing circuit 508 does not couple the rising edge of the C1 signal at time $t_2$ to the input of the VDL 504. Instead, the summing circuit 508 couples the rising edge of the RCLK signal occurring at time $t_3$ to the input of the VDL 504, as shown by the dotted line of signal C1. The rising edge of the RCLK signal at time $t_3$ also causes the mode control circuit 520 to switch the MCRL signal X to 1 so that the DELCLK signal (C1) is coupled to the input of the VDL 504. The summing circuit 508 therefore couples the falling edge of the C2 signal at time $t_6$ to the input of the VDL 504 so that, after propagating through the inverters A, B, C, it produces a signal C3 having a rising edge at time $t_9$ that is aligned with the rising edge of the RCLK signal. Switching the MCRL signal X in this manner therefore prevents the PD 512 from generating spurious phase error signals. Basically, it accomplishes this function by substituting the rising edge of the RCLK signal for a rising edge of the DELCLK signal since the rising edge of the DELCLK signal is produced by delaying the falling edge of the RCLK signal, which occurs at a phase other than 180 degrees when the duty cycle is other than 50%

Figure 11:
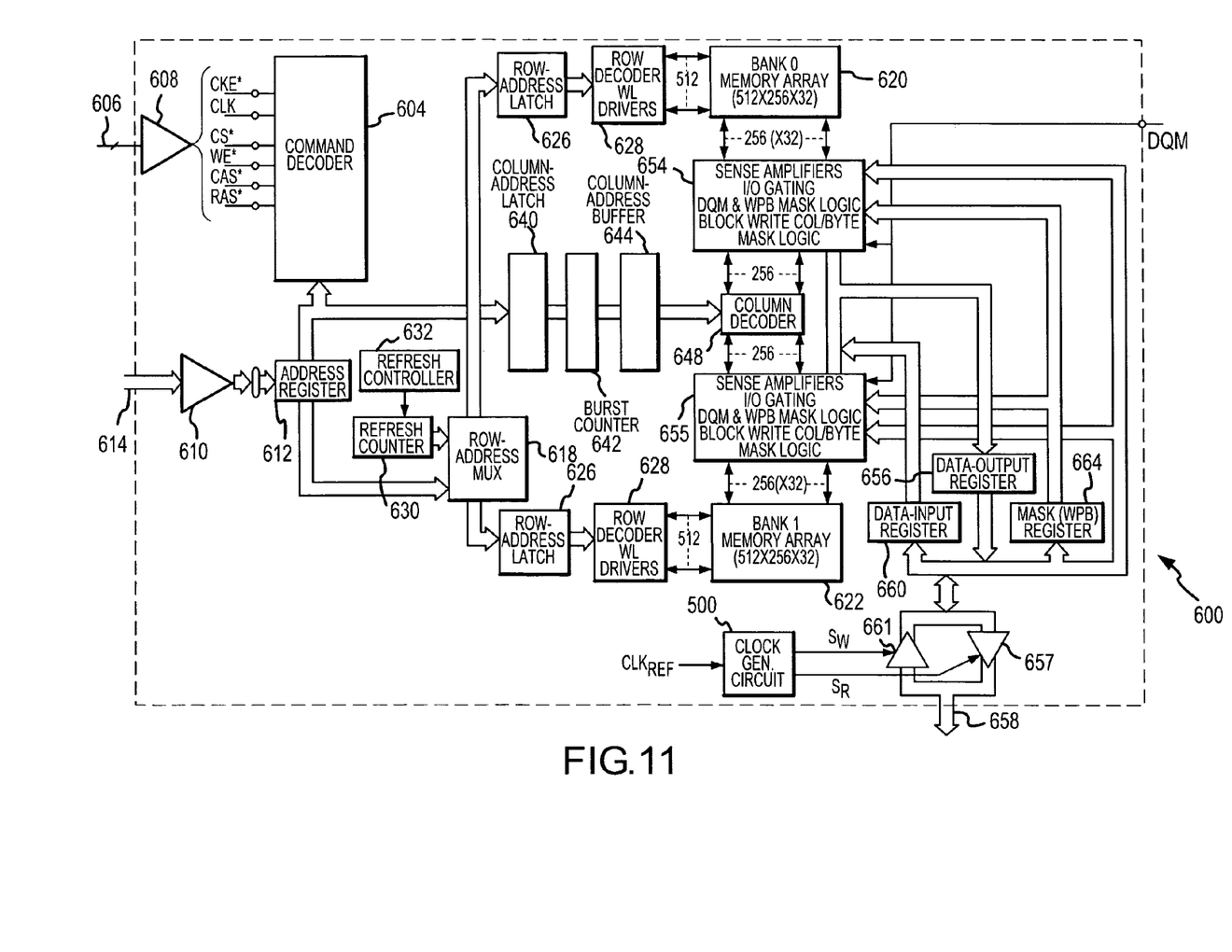
FIG. 11 is a block diagram of a memory device using the clock generating circuit according to one embodiment of the invention.

Signal generating circuits according to various embodiments of the present invention can be used for a variety of purposes in electronic devices, such as memory devices. For example, with reference to FIG. 11, a synchronous dynamic random access memory ("SDRAM") 600 includes a command decoder 604 that controls the operation of the SDRAM 600 responsive to high-level command signals received on a control bus 606 and coupled thorough input receivers 608. These high level command signals, which are typically generated by a memory controller (not shown in FIG. 11), are a clock enable signal CKE\*, a clock signal CLK, a chip select signal CS\*, a write enable signal WE\*, a row address strobe signal RAS\*, a column address strobe signal CAS\*, and a data mask signal DQM, in which the "\*"

designates the signal as active low. The command decoder 604 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The SDRAM 600 includes an address register 612 that receives row addresses and column addresses through an address bus 614. The address bus 614 is generally coupled through input receivers 610 and then applied to a memory controller (not shown in FIG. 11). A row address is generally first received by the address register 612 and applied to a row address multiplexer 618. The row address multiplexer 618 couples the row address to a number of components associated with either of two memory banks 620, 622 depending upon the state of a bank address bit forming part of the row address. Associated with each of the memory banks 620, 622 is a respective row address latch 626, which stores the row address, and a row decoder 628, which decodes the row address and applies corresponding signals to one of the arrays 620 or 622. The row address multiplexer 618 also couples row addresses to the row address latches 626 for the purpose of refreshing the memory cells in the arrays 620, 622. The row addresses are generated for refresh purposes by a refresh counter 630, which is controlled by a refresh controller 632. The refresh controller 632 is, in turn, controlled by the command decoder 604.

After the row address has been applied to the address register 612 and stored in one of the row address latches 626, a column address is applied to the address register 612. The address register 612 couples the column address to a column address latch 640. Depending on the operating mode of the SDRAM 600, the column address is either coupled through a burst counter 642 to a column address buffer 644, or to the burst counter 642 which applies a sequence of column addresses to the column address buffer 644 starting at the column address output by the address register 612. In either case, the column address buffer 644 applies a column address to a column decoder 648.

Data to be read from one of the arrays 620, 622 is coupled to the column circuitry 654, 655 for one of the arrays 620, 622, respectively. The data is then coupled through a data output register 656 and data output drivers 657 to a data bus 658. The data output drivers 657 apply the read data to the data bus 658 responsive to a read data strobe signal $S_R$ generated from a delayed clock signal produced by a various embodiments of a clock generating circuit 500 in accordance with the present invention. The SDRAM 600 shown in FIG. 11 is a double data rate ("DDR") SDRAM that inputs or outputs data twice each clock period. The clock generating circuit 500 receives the reference clock $CLK_{REF}$ signal and generates the read data strobe $S_R$ responsive to a delayed clock signal generated by the voltage controlled delay line 504 (FIG. 5).

Data to be written to one of the arrays 620, 622 are coupled from the data bus 658 through data input receivers 661 to a data input register 660. The data input receivers 661 couple the write data from the data bus 658 responsive to a write data strobe signal $S_W$, which is generated from the delayed clock signal generated by the voltage controlled delay line 504 (FIG. 5). The write data are coupled to the column circuitry 654, 655 where they are transferred to one of the arrays 620, 622, respectively. A mask register 664 responds to a data mask DM signal to selectively alter the flow of data into and out of the column circuitry 554, 655, such as by selectively masking data to be read from the arrays 620, 622.

Figure 12:
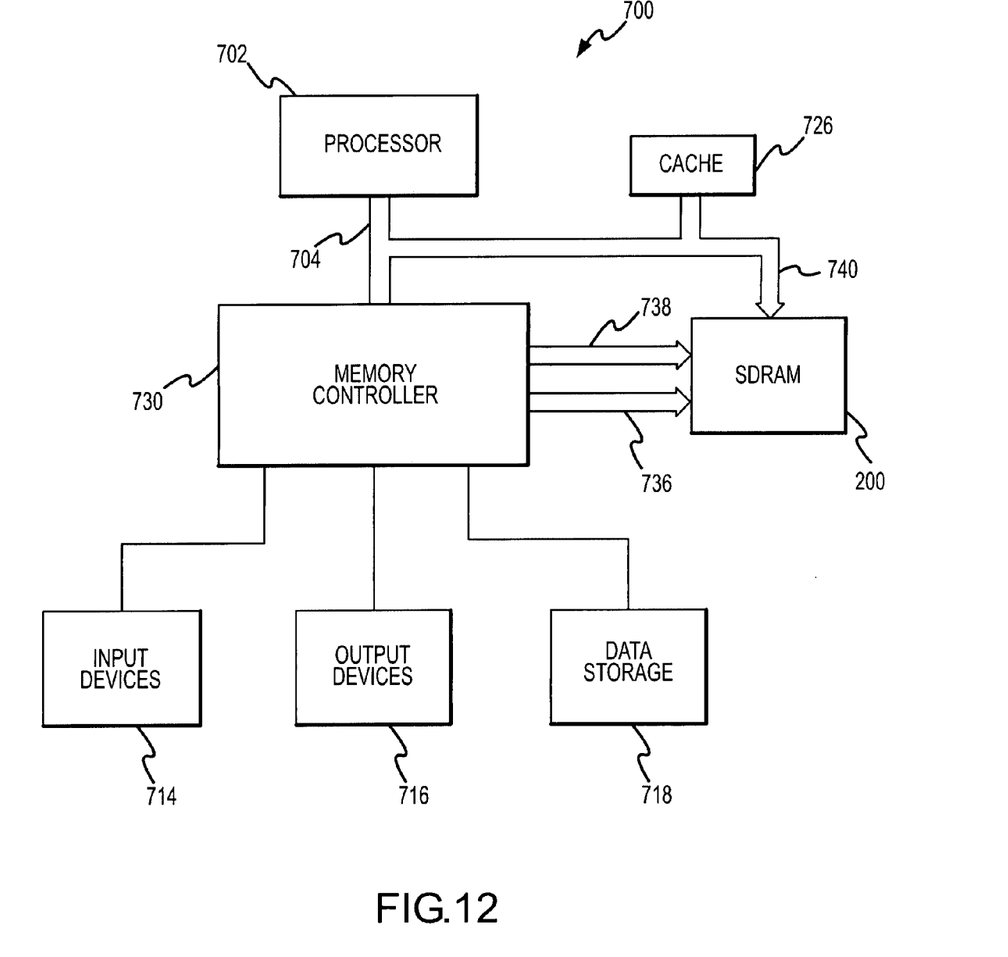
FIG. 12 is a block diagram of a processor-based system using the memory device of FIG. 11.

The SDRAM 600 shown in FIG. 11 can be used in various electronic systems. For example, it may be used in a processor-based system, such as a processor-based system 700 shown in FIG. 12. The processor-based system 700 includes a processor 702 for performing various computing functions, such as executing specific software to perform specific calculations or tasks. The processor 702 includes a processor bus 704 that normally includes an address bus, a control bus, and a data bus. In addition, the processor-based system 700 includes one or more input devices 714, such as a keyboard or a mouse, coupled to the processor 702 to allow an operator to interface with the processor-based system 700. Typically, the processor-based system 700 also includes one or more output devices 716 coupled to the processor 702, such output devices typically being a printer or a video terminal. One or more data storage devices 718 are also typically coupled to the processor 702 to allow the processor 702 to store data in or retrieve data from internal or external storage media (not shown). Examples of typical storage devices 718 include hard and floppy disks, tape cassettes, and compact disk read-only memories (CD-ROMs). The processor 702 is also typically coupled to cache memory 726, which is usually static random access memory ("SRAM"), and to the SDRAM 600 through a memory controller 730. The memory controller 730 normally includes a control bus 736 and an address bus 738 that are coupled to the SDRAM 600. A data bus 740 is coupled from the SDRAM 600 to the processor bus 704 either directly (as shown), through the memory controller 730, or by some other means.

It is to be understood that even though an embodiment and advantages of the present invention have been set forth in the foregoing description, the above disclosure is illustrative only, and changes may be made in detail, and yet remain within the broad principles of the invention. Therefore, the present invention is to be limited only by the appended claims.

What is claimed is:

1. A selection circuit comprising:
   a combining circuit having a first input terminal to receive a first clock signal, a second input terminal to receive a second clock signal, and a third input terminal to receive a selection signal, the selection circuit being operable to generate an output having a value of F(X), where F(X)=X*(CLK1)+(1−X)*(CLK2), where X represents the value of the selection signal, CLK1 represents a value of the first clock signal, and CLK2 represents a value of the second clock signal; and
   a control circuit operable to generate the selection signal in a manner that causes the selection to have a value between a first level and a second level that is determined by a control signal received by the control circuit.

2. The selection circuit of claim 1 wherein the first clock signal comprises a delayed clock signal and the second clock signal comprises a reference clock signal.

3. The selection circuit of claim 2 wherein the selection signal has a value between 0 and 1.

4. The selection circuit of claim 3 wherein the selection signal has a value of 0.5.

5. The selection circuit of claim 4 wherein the output comprises a first output signal and a second output signal followed by the first output signal.

6. The selection circuit of claim 5 wherein the first output signal comprises the delayed clock signal and the second output signal comprises the reference clock signal.

7. The selection circuit of claim 1 further comprises varying the value of the X, where varying the value of X varies the output.

8. The selection circuit of claim 1 wherein the control signal received by the control circuit comprises a plurality of control signals received by the control circuit.

9. A method of operating a selection circuit, comprising:
receiving a first clock signal;
receiving a second clock signal;
receiving a control signal having a value between a first level and a second level;
generating an output signal having a value of F(X), where $F(X)=X*CLK1+(1-X)*CLK2$), where X represents the value of the control signal, CLK1 represents the value of the first clock signal, CLK2 represents the value of the second clock signal.

10. The method of claim 9 wherein the control signal has a value between 0 and 1.

11. The method of claim 9 wherein the control signal value is 0.5.

12. The method of claim 9 wherein the first clock signal comprises a delayed clock signal and the second clock signal comprises a reference clock signal.

* * * * *